(12) United States Patent
Inoue et al.

(10) Patent No.: US 6,617,240 B2
(45) Date of Patent: Sep. 9, 2003

(54) METHOD OF FABRICATING SEMICONDUCTOR DEVICE

(75) Inventors: Yasunori Inoue, Ohgaki (JP); Naoteru Matsubara, Gifu (JP); Hidetaka Nishimura, Gifu (JP); Hideki Mizuhara, Bisai (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/748,230

(22) Filed: Dec. 27, 2000

(65) Prior Publication Data

US 2001/0005628 A1 Jun. 28, 2001

(30) Foreign Application Priority Data

Dec. 27, 1999 (JP) ............................................. 11-371635

(51) Int. Cl.$^7$ ......................................... H01L 21/4763
(52) U.S. Cl. ....................... 438/623; 438/618; 438/622; 438/652; 438/688
(58) Field of Search ................................ 438/623, 618, 438/622, 652, 688, 627, 628

(56) References Cited

U.S. PATENT DOCUMENTS 6,107,182 A * 8/2000 Asahina et al. ............. 438/618

FOREIGN PATENT DOCUMENTS

| JP | 4-234149 | | 8/1992 |
|----|----------|---|--------|
| JP | 9-312339 | | 12/1997 |
| JP | 10-242278 | * | 9/1998 |
| JP | 11-317453 | | 11/1999 |

OTHER PUBLICATIONS

"High Temperature Aluminum Planarization Process for ULSI Devices," by Chen et al., 1994 VMIC Conference (Jun. 7–8, 1994), pp. 374–376.

* cited by examiner

Primary Examiner—Matthew Smith
(74) Attorney, Agent, or Firm—McDermott, Will & Emery

(57) ABSTRACT

A method of fabricating a semiconductor device capable of attaining an excellent embedding characteristic also when an opening has a small diameter is obtained. According to this method of fabricating a semiconductor device, an interlayer dielectric film having an opening is formed. A first conductive member is formed in the opening by sputtering. In advance of formation of the first conductive member, first heat treatment is performed at a temperature capable of reducing the quantity of moisture and hydroxyl groups in the interlayer dielectric film. Thus, the interlayer dielectric film has a small quantity of moisture and hydroxyl groups when the first conductive member is embedded in the opening, whereby the embedding characteristic of the first conductive member is improved. Consequently, electric characteristics of a contact part can be improved also when the opening has a small diameter.

14 Claims, 4 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, it relates to a method of fabricating a semiconductor device formed with a conductive member in an opening.

2. Description of the Prior Art

In relation to multilevel interconnections recently employed for a highly integrated semiconductor device, reduction of resistance of a wire-to-wire contact (via contact) and improvement of reliability of the wires are required.

Further, the degree of integration of the semiconductor device is increasingly improved and hence the diameter of a contact hole (regarded as a synonym for a via hole) must be reduced. When the diameter of the contact hole is reduced, however, it is difficult to deposit a wiring material in the contact hole with a sufficient thickness.

High-temperature sputtering has been generally employed as one of methods of embedding wiring materials. The high-temperature sputtering is disclosed in "High Temperature Aluminum Planarization Process for ULSI Devices", Jun. 7–8, 1994 VMIC Conference, 1994 ISMIC-103/94-0374, pp. 374 to 376, for example. According to this high-temperature sputtering, filling of a contact hole and formation of a wire can be performed through a single step by sputtering a wiring material while heating a wafer to a high temperature. Thus, the number of fabrication steps for a semiconductor device can be reduced for suppressing the fabrication cost. The wiring material is most generally prepared from an aluminum alloy.

As the diameter of the contact hole is reduced following improvement in degree of integration of the semiconductor device, it is difficult to fill up the contact hole through the conventional high-temperature sputtering. More specifically, an interlayer dielectric film discharges moisture and hydroxyl groups into the contact hole as a gas, to disadvantageously increase pressure in the contact hole and inhibit flowability of the aluminum alloy. Such disadvantage remarkably takes place as the diameter of the contact hole is reduced. Consequently, excellent electric characteristics cannot be attained.

SUMMARY OF THE INVENTION

An object of the present invention is to provide a method of fabricating a semiconductor device capable of attaining an excellent embedding characteristic also when an opening (contact hole/via hole) has a small diameter.

Another object of the present invention is to improve wettability of a conductive member embedded in the opening in the aforementioned method of fabricating a semiconductor device.

Still another object of the present invention is to prevent the conductive member from disconnection in the aforementioned method of fabricating a semiconductor device.

A method of fabricating a semiconductor device according to an aspect of the present invention comprises steps of forming an interlayer dielectric film having an opening, forming a first conductive member in the opening by sputtering, and performing first heat treatment at a temperature capable of reducing the quantity of moisture and hydroxyl groups in the interlayer dielectric film in advance of formation of the first conductive member.

In the method of fabricating a semiconductor device according to the aforementioned aspect, the first heat treatment is previously performed at the temperature capable of reducing the quantity of moisture and hydroxyl groups in the interlayer dielectric film in advance of formation of the first conductive member so that the interlayer dielectric film has a small quantity of moisture and hydroxyl groups when the first conductive member is embedded in the opening, whereby the embedding characteristic of the first conductive member is improved. Consequently, electric characteristics of a contact part can be improved also when the opening has a small diameter.

Preferably, the method of fabricating a semiconductor device according to the aforementioned aspect further comprises a step of forming a second conductive member containing titanium in the opening after performing the first heat treatment in advance of formation of the first conductive member. In this case, wettability of the first conductive member is improved. Thus, the embedding characteristic of the first conductive member with respect to the opening can be improved, whereby an excellent contact characteristic can be attained also when the opening has a small diameter. In this case, the second conductive member may be formed by a multilayer film of a titanium layer and a titanium nitride layer.

In the method of fabricating a semiconductor device according to the aforementioned aspect, the step of forming the first conductive member preferably includes a step of performing the sputtering at a low temperature and thereafter performing the sputtering at a high temperature thereby forming the first conductive member. In this case, wettability of the first conductive member is improved. Thus, the embedding characteristic of the first conductive member with respect to the opening can be improved, whereby an excellent contact characteristic can be attained also when the opening has a small diameter.

In the method of fabricating a semiconductor device according to the aforementioned aspect, the interlayer dielectric film preferably includes an organic SOG film. Thus, flatness of the interlayer dielectric film is so improved that the first conductive member formed on the upper surface of the interlayer dielectric film can be prevented from disconnection. In this case, the method of fabricating a semiconductor device preferably further comprises a step of introducing an impurity into the organic SOG film in advance of formation of the first conductive member. Thus, the organic SOG film containing the introduced impurity discharges a small quantity of gas of moisture and hydroxyl groups also when the same is kept at a high temperature, whereby the embedding characteristic of the first conductive member with respect to the opening can be further improved. Consequently, an excellent contact characteristic can be attained also when the opening has a small diameter.

In this case, the method of fabricating a semiconductor device preferably further comprises a step of performing second heat treatment on the organic SOG film containing the introduced impurity in advance of formation of the first conductive member. The number of dangling bonds is reduced in the organic SOG film containing the introduced impurity due to this structure. Thus, hygroscopicity of the organic SOG film containing the introduced impurity is further reduced, to allow permeation of a smaller quantity of moisture. Consequently, the organic SOG film discharges a smaller quantity of gas of moisture and hydroxyl groups, whereby the embedding characteristic of the first conductive member with respect to the opening can be further improved.

A method of fabricating a semiconductor device according to another aspect of the present invention comprises steps of forming an interlayer dielectric film having an opening, forming a first conductive member in the opening by sputtering, and performing first heat treatment at a temperature exceeding the sputtering temperature for the sputtering in advance of formation of the first conductive member.

In the method of fabricating a semiconductor device according to the aforementioned aspect, the first heat treatment is previously performed at a temperature exceeding the sputtering temperature for the sputtering in advance of formation of the first conductive member so that the quantity of moisture and hydroxyl groups in the interlayer dielectric film is reduced when the first conductive member is embedded in the opening by sputtering, whereby the embedding characteristic of the first conductive member is improved. Consequently, electric characteristics of a contact part can be improved also when the opening has a small diameter.

Preferably, the method of fabricating a semiconductor device according to the aforementioned aspect further comprises a step of forming a second conductive member containing titanium in the opening after performing the first heat treatment in advance of formation of the first conductive member. In this case, wettability of the first conductive member is improved. Thus, the embedding characteristic of the first conductive member with respect to the opening can be improved, whereby an excellent contact characteristic can be attained also when the opening has a small diameter. In this case, the second conductive member may be formed by a multilayer film of a titanium layer and a titanium nitride layer.

In the method of fabricating a semiconductor device according to the aforementioned aspect, the step of forming the first conductive member preferably includes a step of performing the sputtering at a low temperature and thereafter performing the sputtering at a high temperature thereby forming the first conductive member. In this case, wettability of the first conductive member is improved. Thus, the embedding characteristic of the first conductive member with respect to the opening can be improved, whereby an excellent contact characteristic can be attained also when the opening has a small diameter.

In the method of fabricating a semiconductor device according to the aforementioned aspect, the interlayer dielectric film preferably includes an organic SOG film. In this case, flatness of the interlayer dielectric film is so improved that the first conductive member formed on the upper surface of the interlayer dielectric film can be prevented from disconnection. In this case, the method of fabricating a semiconductor device preferably further comprises a step of introducing an impurity into the organic SOG film in advance of formation of the first conductive member. Thus, the organic SOG film containing the introduced impurity discharges a small quantity of moisture and hydroxyl groups also when the same is kept at a high temperature, whereby the embedding characteristic of the first conductive member with respect to the opening can be further improved. Consequently, an excellent contact characteristic can be attained also when the opening has a small diameter.

In this case, the method of fabricating a semiconductor device preferably further comprises a step of performing second heat treatment on the organic SOG film containing the introduced impurity. The quantity of dangling bonds is reduced in the organic SOG film containing the introduced impurity due to this structure. Thus, hygroscopicity of the organic SOG film containing the impurity is further reduced, to allow permeation of a smaller quantity of moisture. Consequently, the organic SOG film discharges a smaller quantity of gas of moisture and hydroxyl groups, whereby the embedding characteristic of the first conductive member with respect to the opening can be further improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
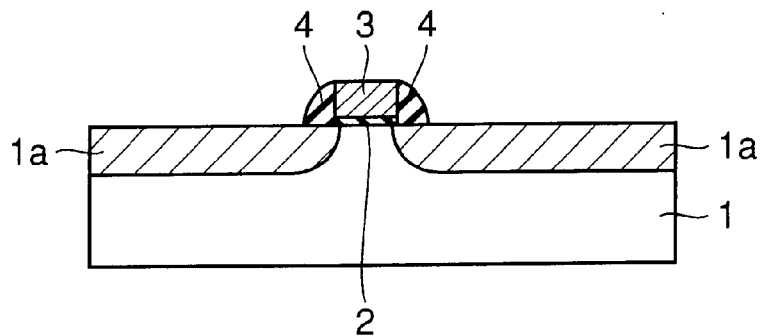
FIGS. 1 to 9 are schematic sectional views showing a fabrication process for a semiconductor device according to an embodiment of the present invention.
Figure 2:
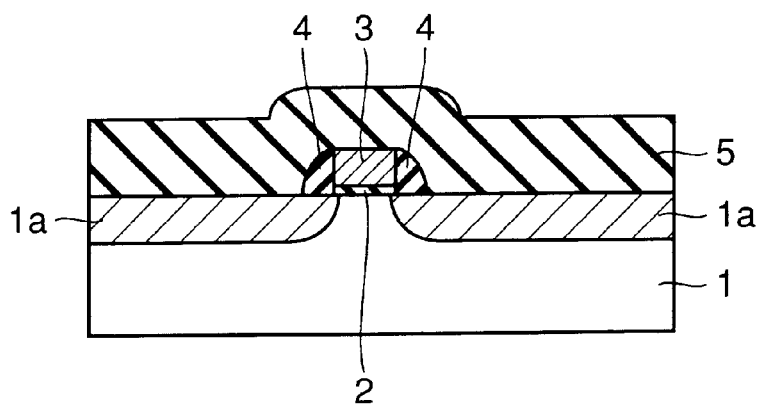
Figure 3:
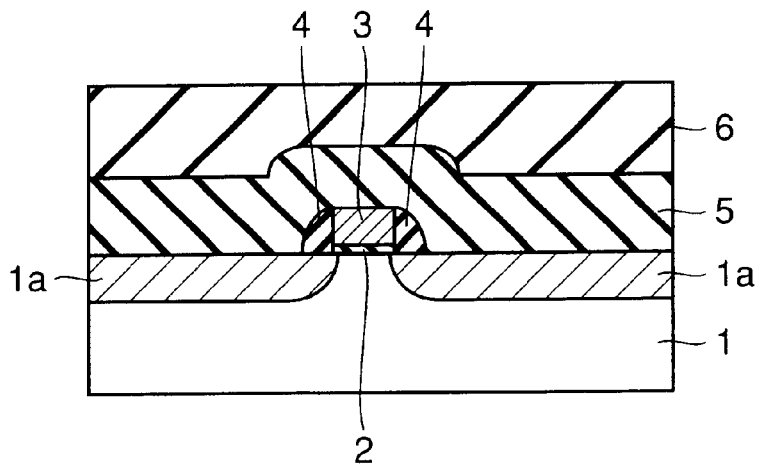
Figure 4:
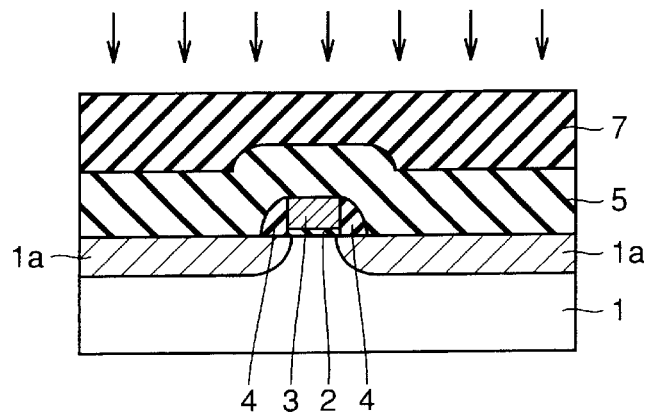
Figure 5:
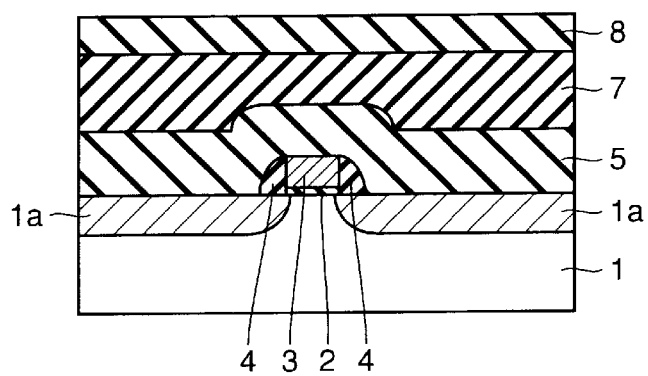
Figure 6:
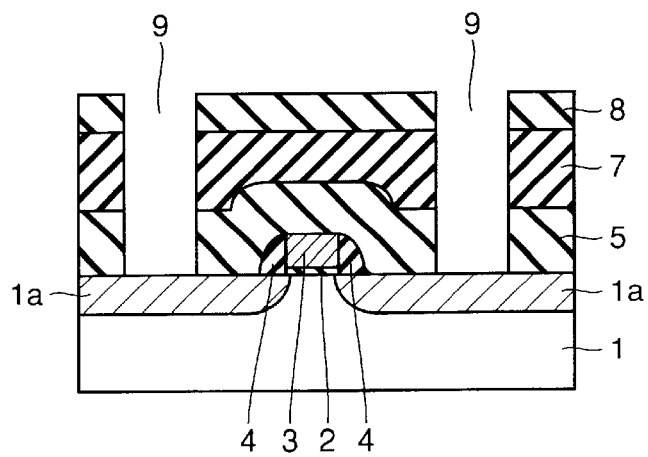
Figure 7:
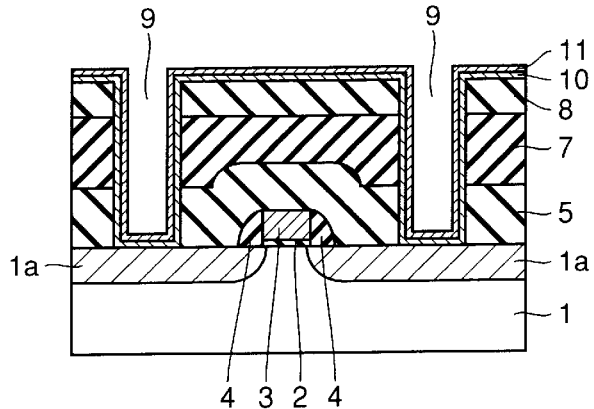

A method of fabricating a semiconductor device according to an embodiment of the present invention is now described with reference to FIGS. 1 to 9.

Step 1 (See FIG. 1):

A gate insulator film 2 (thickness: 4 nm) and a gate electrode 3 (thickness: 200 nm) are formed on a (100) p-type (or n-type) single-crystalline silicon substrate 1. The substrate 1 is doped with an n-type (or p-type) impurity by ion implantation through the gate insulator film 2 and the gate electrode 3 serving as masks, thereby forming a pair of source/drain regions 1a in a self-aligned manner. Thus, a MOS transistor formed by the pair of source/drain regions 1a and the gate electrode 3 is defined. Side wall insulator films 4 are formed on the side surfaces of the gate insulator film 2 and the gate electrode 3.

Step 2 (See FIG. 2):

A silicon oxide film 5 (thickness: 500 nm) is formed on the overall surface of the device by plasma CVD. A gas employed in this plasma CVD is prepared from monosilane and nitrous oxide ($SiH_4+N_2O$), monosilane and oxygen ($SiH_4+O_2$), TEOS (tetraethoxysilane) and oxygen ($TEOS+O_2$) or the like, and the film forming temperature is 300° C. to 900° C.

Step 3 (See FIG. 3):

An organic SOG film 6 having a thickness of 400 nm is formed on the silicon oxide film 5. The composition of this organic SOG film 6 is [$CH_4Si(OH)_3$].

A method of forming the organic SOG film 6 is now described. First, an alcoholic solution (e.g. IPA+acetone) of a silicon compound having the aforementioned composition is dropped on the substrate 1. The substrate 1 is rotated at a speed of 5400 rpm for 20 seconds, thereby forming a coating of the solution on the substrate 1. At this time, the coating of the alcoholic solution is formed with a large thickness for a concave portion of a step defined on the substrate 1 and with a small thickness for a convex portion, for relaxing the step. Consequently, the surface of the coating of the alcoholic solution is flattened.

Then, heat treatment is performed in a nitrogen atmosphere successively at 100° C. for one minute, at 200° C. for one minute, at 300° C. for one minute, at 22° C. for one minute and at 300° C. for 30 minutes, thereby evaporating the alcohol and progressing polymerization. Thus, the organic SOG film 6 having a flat surface is formed.

Step 4 (See FIG. 4):

The organic SOG film 6 is doped with argon ions (Ar$^+$) by ion implantation under conditions of acceleration energy of 140 keV and a dose of $1\times10^{15}$ atoms/cm$^2$. Thus, organic components are decomposed while reducing the quantity of moisture and hydroxyl groups contained in the organic SOG film 6. Consequently, the organic SOG film 6 is converted to an SOG film (hereinafter referred to as a modified SOG film) 7 containing no organic components and only a small quantity of moisture and hydroxyl groups.

Step 5 (See FIG. 5):

A silicon oxide film 8 (thickness: 200 nm) is formed on the modified SOG film 7 by plasma CVD. Conditions for forming the silicon oxide film 8 are identical to those for the silicon oxide film 5.

Step 6 (See FIG. 6):

Anisotropic etching is performed with an etching gas prepared from a gas mixture of carbon tetrafluoride and hydrogen thereby forming contact holes 9 through the films 5, 7 and 8 located on the source/drain regions 1a.

Step 7 (See FIG. 7):

Heat treatment is performed in a vacuum chamber thereby previously removing (degassing) moisture and hydroxyl groups slightly contained in the modified SOG film 7 exposed in the contact holes 9. The term degassing indicates operation of discharging moisture and hydroxyl groups as a gas. While a proper temperature for the heat treatment is 450° C., the temperature can be properly adjusted in the range of 400° C. to 500° C. This temperature is set in excess of the temperature for sputtering described later.

Then, a titanium (Ti) thin film 10 (thickness: 30 nm) and a titanium nitride (TiN) thin film 11 (thickness: 50 nm) are formed on the silicon oxide film 8 including the portions located in the contact holes 9 by magnetron sputtering. The titanium thin film 10 and the titanium nitride thin film 11 are so formed as to improve wettability of an aluminum alloy film 12 described later in sputtering, whereby the aluminum alloy film 12 can be excellently embedded in the contact holes 9. The sputtering temperature for the titanium thin film 10 and the titanium nitride thin film 11 is about 100° C. This sputtering temperature is not at a level capable of removing moisture and hydroxyl groups from the modified SOG film 7, dissimilarly to the temperature for the heat treatment for the aforementioned degassing.

Figure 8:
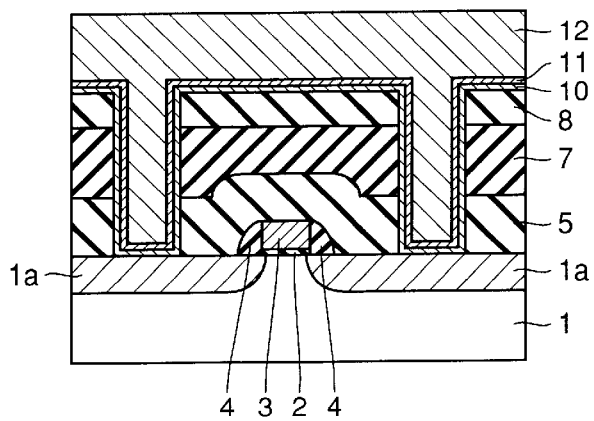
Figure 9:
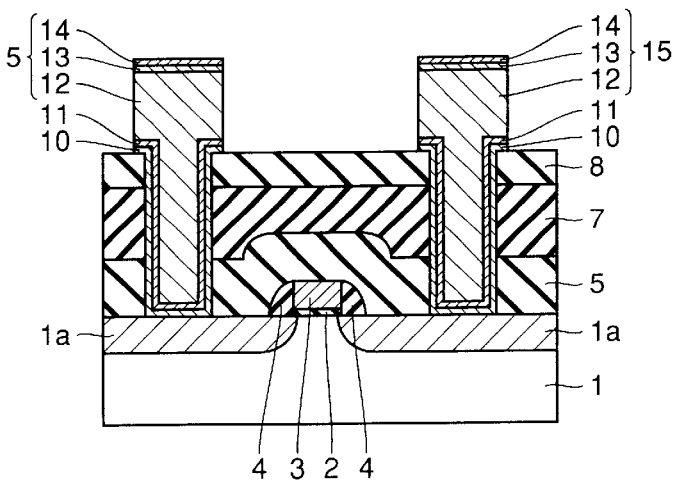

Step 8 (See FIG. 8)

The aluminum (Al) alloy film 12 (thickness: 700 nm) is formed on the titanium nitride thin film 11 including the portions located in the contact holes 9 by sputtering, while filling up the contact holes 9 with the aluminum alloy film 12.

At this time, the aluminum alloy film 12 is first formed by 200 nm at a low temperature (0° C. to 150° C.) and thereafter the sputtering temperature is increased to a high level (400° C. to 475° C.) for forming the remaining part of the aluminum alloy film 12. Aluminum sputtering is performed in two stages of low and temperatures since titanium and aluminum abruptly react with each other to deteriorate the effect of improving wettability of titanium if the aluminum alloy film 12 is formed at a high temperature from the first.

Step 9 (See FIG. 9):

A titanium film 13 (thickness: 50 nm) and a titanium nitride film 14 (thickness: 20 nm) are successively formed in this order on the aluminum alloy film 12 by magnetron sputtering.

Then, the aluminum alloy film 12, the titanium film 13 and the titanium nitride film 14 are patterned into prescribed shapes by general lithography and dry etching (reactive ion etching (RIE) or the like) through a step of applying resist (not shown), an exposure step and an etching step. Thus, upper-layer metal wires 15 are defined by the remaining portions of the aluminum alloy film 12, the titanium film 13 and the titanium nitride film 14.

The modified SOG film 7 embedded in the contact holes 9 has a smaller quantity of moisture and hydroxyl groups as compared with the organic SOG film 6 as hereinabove described, thereby discharging only a small quantity of moisture and hydroxyl groups also when the same is exposed to a high temperature. According to this embodiment, heat treatment is performed at a temperature higher than the sputtering temperature before sputtering the aluminum alloy film 12 as described above, thereby previously degassing the small quantity of moisture and hydroxyl groups from the modified SOG film 7. Thus, the contact holes 9 hardly generate a gas when the aluminum alloy film 12 is embedded by sputtering, whereby the embedding characteristic is improved. Therefore, the aluminum alloy film 12 can be excellently formed in the contact holes 9. Consequently, the electric characteristics of a contact part can be improved.

According to this embodiment, further, the aluminum alloy film 12 is first formed at a low temperature in sputtering, thereby avoiding abrupt reaction between titanium and aluminum and maintaining wettability of titanium. Thus, the interface between titanium and aluminum is maintained in excellent wettability when the aluminum alloy film 12 is embedded by sputtering, whereby the embedding characteristic is improved. Therefore, the aluminum alloy film 12 can be excellently formed in the contact holes 9. Consequently, the electric characteristics of the contact part can be improved.

According to this embodiment, the modified SOG film 7 contains no organic components and hence the etching for forming the contact holes 9 can be performed in an atmosphere of a gas mixture of carbon tetrafluoride and hydrogen. Also when employing photoresist as an etching mask for this etching, the photoresist is not corroded. Thus, no part of the modified SOG film 7 masked with the photoresist is etched. Consequently, the fine contact holes 9 can be correctly formed.

According to this embodiment, the etching rate of the modified SOG film 7 containing no organic components is identical to that of the silicon oxide films 5 and 8. Further, the modified SOG film 7 is not contracted in ashing for removing the photoresist employed as the etching mask. Therefore, the modified SOG film 7 is neither cracked nor recessed in formation of the contact holes 9. Thus, the aluminum alloy film 12 can be excellently formed in the contact holes 9 by high-temperature sputtering. Consequently, the electric characteristics of the contact part can be improved.

Figure 10:
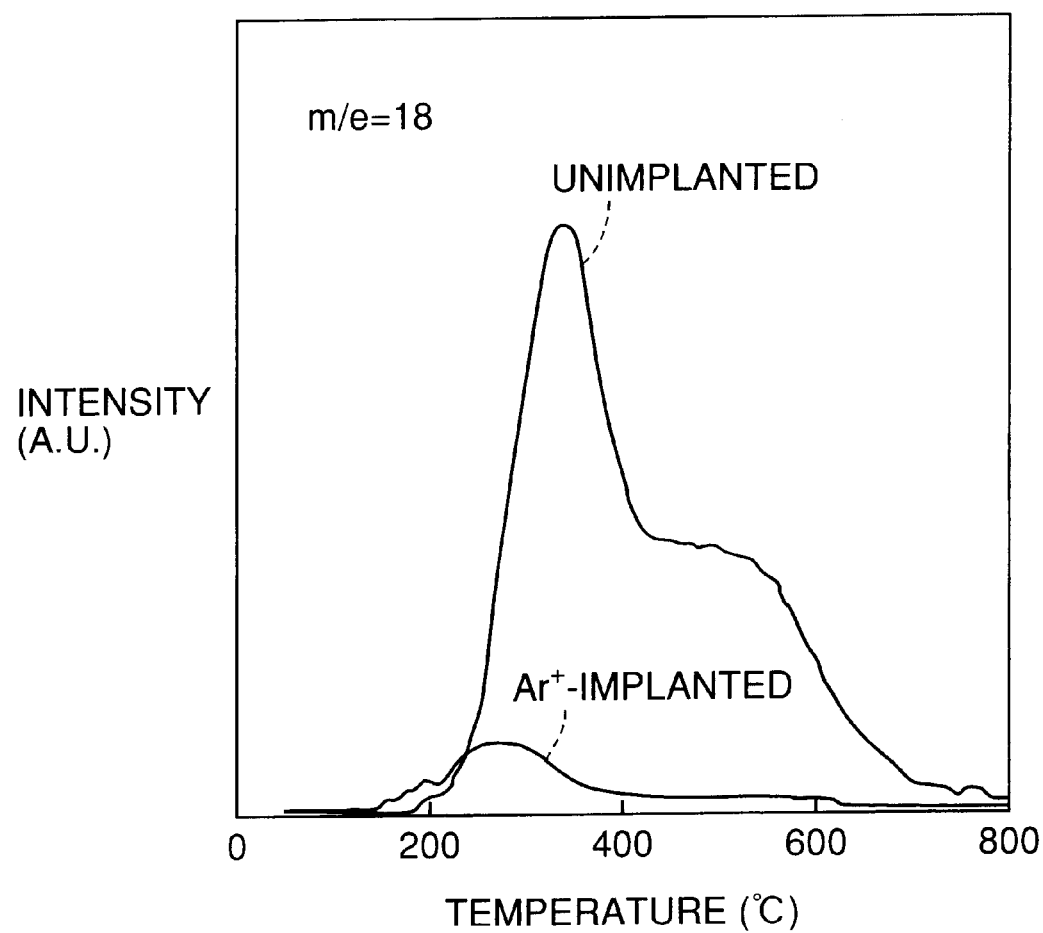
FIG. 10 is a characteristic diagram for illustrating effects of the embodiment of the present invention.

FIG. 10 shows results obtained by heat-treating the modified SOG film 7 in a nitrogen atmosphere for three minutes and evaluating the same by TDS (thermal desorption spectroscopy). Ion implantation conditions are a dose of $1\times10^{15}$ atoms/cm$^2$ and acceleration energy of 140 keV. In the modified SOG film 7, relative intensity of H$_2$O (m/e=18) is 1/10 as compared with the organic SOG film 6. This result indicates that degassing from the contact holes is reduced when embedding a wiring material in the contact holes.

The present invention is not restricted to the aforementioned embodiment but similar functions/effects can be attained also when carrying out the present invention as follows:

(1) In the step 7, the temperature for the heat treatment may be lower than that of the high-temperature sputtering in the step 8. So far as the heat treatment is performed at a temperature (at least 400° C. in the embodiment) allowing degassing from the modified SOG film 7, degassing can be suppressed in the high-temperature sputtering in the step 8.

(2) The organic SOG film 6 is replaced with a film of polyimide or siloxane-formed polyimide.

(3) Silicon oxide films formed by a method (atmospheric CVD, low pressure CVD, ECR plasma CVD, photo assisted CVD, TEOS-CVD, PVD or the like) other than plasma CVD are employed as the silicon oxide films 5 and 8. In this case, a gas employed in the atmospheric CVD is prepared from monosilane and oxygen ($SiH_4+O_2$), and the film forming temperature is not more than 400° C. On the other hand, a gas employed in the low pressure CVD is prepared from monosilane and nitrous oxide ($SiH_4+N_2O$), and the film forming temperature is not more than 900° C.

(4) The silicon oxide films 5 and 8 are replaced with other insulator films (silicon nitride films, silicate glass films, BPSG (borophosphosilicate glass) films or the like) having high mechanical strength in addition to the property of cutting off moisture and hydroxyl groups. The insulator films may be formed by a method such as CVD or PVD.

(5) The aluminum alloy film 12 is replaced with a film of a conductive material (copper, gold, silver, an alloy such as titanium nitride (TiN) or tungsten titanium (TiW) or the like) or a multilayer structure thereof.

(6) Heat treatment is performed on the modified SOG film 7. In this case, the quantity of dangling bonds is reduced in the modified SOG film 7, whereby hygroscopicity is further reduced to allow permeation of a smaller quantity of moisture.

(7) While argon ions are employed as the ions implanted into the organic SOG film 6 in the aforementioned embodiment, any ions are employable so far as the same can modify the organic SOG film 6 as a result.

More specifically, argon ions, boron ions and nitrogen ions are most suitable. In addition thereto, the modifying effect can be sufficiently expected also in the following ions:

(i) Inert gas ions (helium ions, neon ions, krypton ions, xenon ions and radon ions) other than argon ions. An inert gas is non-reactive with the organic SOG film 6, and exerts no bad influence by ion implantation.

(ii) Ions of simple elements belonging to the groups IIIb, IVb, Vb, VIb and VIIb other than boron and nitrogen and ions of compounds thereof. In particular, simple element ions of oxygen, aluminum, sulfur, chlorine, gallium, germanium, arsenic, selenium, bromine, antimony, iodine, indium, tin, tellurium, lead, bismuth and compound ions thereof.

Among these, the metal element ions have a possibility of reducing the dielectric constant of the organic SOG film 6 after ion implantation, while the quantity thereof is extremely small and hence no problem is caused in practice unless an interlayer dielectric film having a particularly high dielectric constant is required.

(iii) Ions of simple elements belonging to the groups IVa and Va and ions of compounds thereof. In particular, simple element ions of titanium, vanadium, niobium, hafnium and tantalum and compound ions thereof. Oxides of the elements belonging to the groups IVa and Va have high dielectric constants and can increase the dielectric constant of the organic SOG film 6 after ion implantation.

(iv) A plurality of types of ions are employed in combination. In this case, a further excellent effect can be attained due to synergistic action of the ions.

(8) While ions are implanted into the organic SOG film 6 in the aforementioned embodiment, the present invention is not restricted to this but the impurity may be in the form of atoms, molecules or particles (generically referred to as an impurity in the present invention).

(9) As the sputtering method, diode sputtering, high-frequency sputtering or four-pole sputtering may be employed in place of the magnetron sputtering.

(10) The titanium nitride thin film 10 is omitted.

(11) The silicon oxide film 8 is omitted.

(12) The lower layer conductive part is formed not by the source/drain regions 1*a* but by a lower-layer metal wire.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device comprising steps of:

forming an interlayer dielectric film having an opening;

forming a first conductive member, which consists of a single layer, in said opening by sputtering; and performing first heat treatment at a temperature capable of reducing the quantity of moisture and hydroxyl groups in said interlayer dielectric film in advance of formation of said first conductive member, wherein said step of forming said first conductive member includes a step of performing said sputtering at a low temperature and thereafter performing said sputtering at a high temperature thereby forming said first conductive member;

the method further comprising a step of forming a second conductive member containing titanium in said opening after performing said first heat treatment in advance of formation of said first conductive member, wherein the second conductive member is formed at a temperature substantially not at a level capable of removing moisture and hydroxyl groups from the interlayer dielectric film.

2. The method of fabricating a semiconductor device according to claim 1, wherein the temperature substantially not at a level capable of removing moisture and hydroxyl groups from the interlayer dielectric film is about 100° C.

3. The method of fabricating a semiconductor device according to claim 2, wherein said second conductive member is formed by a multilayer film of a titanium layer and a titanium nitride layer.

4. The method of fabricating a semiconductor device according to claim 1, wherein said interlayer dielectric film includes an organic SOG film.

5. The method of fabricating a semiconductor device according to claim 4, further comprising a step of introducing an impurity into said organic SOG film in advance of formation of said first conductive member.

6. The method of fabricating a semiconductor device according to claim 5, further comprising a step of performing second heat treatment on said organic SOG film containing introduced said impurity in advance of formation of said first conductive member.

7. A method of fabricating a semiconductor device comprising steps of:

forming an interlayer dielectric film having an opening;

forming a first conductive member, which consists of a single layer, in said opening by sputtering; and performing first heat treatment at a temperature exceeding the sputtering temperature for said sputtering in advance of formation of said first conductive member, wherein said step of forming said first conductive member includes a step of performing said sputtering at a low temperature and thereafter performing said sputtering at a high temperature thereby forming said first conductive member.

8. The method of fabricating a semiconductor device according to claim 7, further comprising a step of forming a second conductive member containing titanium in said opening after performing said first heat treatment in advance of formation of said first conductive member.

9. The method of fabricating a semiconductor device according to claim 7, wherein said second conductive member is formed by a multilayer film of a titanium layer and a titanium nitride layer.

10. The method of fabricating a semiconductor device according to claim 7, wherein said interlayer dielectric film includes an organic SOG film.

11. The method of fabricating a semiconductor device according to claim 10, further comprising a step of introducing an impurity into said organic SOG film in advance of formation of said first conductive member.

12. The method of fabricating a semiconductor device according to claim 11, further comprising a step of performing second heat treatment on said organic SOG film containing introduced said impurity.

13. A method of fabricating a semiconductor device comprising steps of:

forming an interlayer dielectric film having an opening;

forming a first conductive member, which consists of a single layer, in said opening;

performing a first heat treatment at a temperature capable of reducing the quantity of moisture and hydroxyl groups in said interlayer dielectric film in advance of formation of said first conductive member; and forming a second conductive member containing titanium in said opening after performing said first heat treatment in advance of formation of said first conductive member, wherein the second conductive member is formed at a temperature substantially not at a level capable of removing moisture and hydroxyl groups from the interlayer dielectric film.

14. A method of fabricating a semiconductor device comprising steps of:

forming an interlayer dielectric film having an opening;

forming a first conductive member, which consists of a single layer, in said opening; and performing first heat treatment at a temperature exceeding the temperature for forming said first conductive layer.

* * * * *